(12) United States Patent
Nakamura

(10) Patent No.: US 7,128,632 B2
(45) Date of Patent: Oct. 31, 2006

(54) METHOD FOR MANUFACTURING LIGHT-EMITTING DEVICE

(75) Inventor: Yasuo Nakamura, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 277 days.

(21) Appl. No.: 10/747,918

(22) Filed: Dec. 31, 2003

(65) Prior Publication Data

US 2004/0152392 A1    Aug. 5, 2004

(30) Foreign Application Priority Data

Jan. 10, 2003    (JP)    ............... 2003-005095

(51) Int. Cl.
*H05B 33/04* (2006.01)
*H05B 33/10* (2006.01)
(52) U.S. Cl. .................... 445/25; 445/24; 313/512
(58) Field of Classification Search ............. 445/25; 313/512
See application file for complete search history.

(56) References Cited

U.S. PATENT DOCUMENTS

| 4,647,337 | A | * | 3/1987 | Simopoulos et al. ....... 313/512 |
| 5,148,301 | A | | 9/1992 | Sawatsubashi et al. |
| 5,194,027 | A | * | 3/1993 | Kruskopf et al. ............. 445/24 |
| 6,586,496 | B1 | | 7/2003 | Takamatsu et al. |
| 6,677,620 | B1 | * | 1/2004 | Ishii et al. .................. 313/512 |
| 6,696,786 | B1 | * | 2/2004 | Burrows ..................... 313/512 |

FOREIGN PATENT DOCUMENTS

JP    2001-139933    5/2001

OTHER PUBLICATIONS

Takeshi Nishi; U.S. Appl. No. 10/465,877; filed Jun. 20, 2003.

* cited by examiner

*Primary Examiner*—Mariceli Santiago
(74) *Attorney, Agent, or Firm*—Fish & Richardson P.C.

(57) ABSTRACT

A sealing structure is provided without irradiating a pixel portion of a light emitting element by heat or UV light. By the sealing structure, the reliability is enhanced by blocking out oxygen and moisture, and preventing the deterioration of the light emitting element. The sealing structure in which a whole surface of the pixel portion is covered with a sealing material and which has an excellent sealing property is manufactured without being exposed to heat or UV light. In this case, a catalyst for curing a sealing material is formed as a film on a substrate, and a sealing material for covering a pixel portion is applied to the other substrate. Then, the both substrates are bonded together.

53 Claims, 9 Drawing Sheets

32   31

33

34

35

METHOD FOR MANUFACTURING LIGHT-EMITTING DEVICE

BACKGROUND OF THE INVENTION

1. Field of the Invention

The present invention relates to a method for manufacturing a semiconductor device including a circuit made by using thin film transistors (hereinafter, TFT). For example, the present invention relates to a method for manufacturing a light-emitting device comprising a light-emitting element, which emits fluorescence or phosphorescence upon application of an electric field thereto. The light-emitting element includes a pair of electrodes and a layer containing organic compound (hereinafter, an organic compound layer) that is sandwiched between the pair of electrodes. In this specification, the term light-emitting device includes an image display device, a device for emitting light, or a light source (including a lighting system). Also, the following modules are included in the light-emitting device: a module obtained by attaching a connector such as an FPC (flexible printed circuit), a TAB (tape automated bonding) tape, or a TCP (tape carrier package) to a light-emitting element; a module obtained by providing a tip of a TAB tape or a TCP with a printed wiring board; and a module obtained by directly mounting an IC (integrated circuit) to a light-emitting element by the COG (chip on glass) system.

2. Description of the Related Art (EL Element)

In recent years, study of a light-emitting device having an EL element as a self-luminous element has become vigorous. In particular, a light-emitting device using an organic material as an EL material has attracted an attention. The light-emitting device is also referred to as an EL display.

The light-emitting device has no limitation in angle of visibility because the light-emitting device is a self-luminous type, which is different from a liquid crystal display device. In other words, the light-emitting device is superior to a liquid crystal display as a display to be used in the open air, and usages thereof in various ways have been proposed.

The EL element includes an organic compound layer that provides an electro luminescence generated by being applied with an electric field (hereinafter referred to as EL layer), an anode, and a cathode. The luminescence of the organic compound includes light emission (fluorescence) generated when restoring from a singlet excitation state to the ground state, and light emission (phosphorescence) when restoring from a triplet excitation state to the ground state. The light-emitting device manufactured by a film-forming device and a method of forming a film according to the present invention may be applied to both of the cases employing these light-emissions.

A light-emitting element comprising a cathode, an EL layer, and an anode is referred to as an EL element in this specification. There are two methods of forming the EL elements, a method of forming an EL layer between two types of stripe shape electrodes that are formed in such a way that they can mutually intersect (simple matrix method), and a method of forming EL layers between pixel electrodes and opposing electrodes that are disposed in a matrix and are connected to TFTs (active matrix method). However, when the pixel density increases, it is considered preferable to use the active matrix type in which a switch is provided for every pixel (or every dot) since it can be driven at a low voltage.

(Sealing)

An EL material to form an EL layer deteriorates extremely easily, and is easily oxidized or absorbs moisture due to oxygen or moisture. Thus, a light-emitting element has a problem of a decline in luminance or short lifetime.

Conventionally, a light-emitting element is covered with an encapsulating can, the inside is filled with dried nitrogen gas, and a drying agent is further adhered thereto, thereby preventing oxygen or moisture from reaching the light-emitting element.

A thermosetting sealing material and a UV curing material are mainly used as a sealing material for sealing elements. A two-component sealing material is mixed with air bubbles in mixing, a time before bonding after mixing is limited, working efficiency is poor, and thus the two-component sealing material is not used so often.

Although the thermosetting material is cured by heating, a whole element is exposed to high heat for curing, and thus characteristics of the element is deteriorated. It is difficult to enhance productivity, since the time for curing is long. On the other hand, in the case of UV curing material, the speed of curing is high, and productivity can be easily enhanced, an element to be used is not damaged by heat, and thus, the UV curing material is widely used as a sealing material for sealing an EL element (Reference 1: Japanese Patent Application Laid Open No. 2001-139933).

The conventional light-emitting device has the structure that has a light-emitting element in which an electrode on a substrate is formed as an anode, an organic compound layer is formed on the anode, and a cathode is formed on the organic compound layer, and light generated in the organic compound layer is emitted through the anode formed as a transparent electrode toward a TFT (hereinafter, the structure is referred to as a bottom emission). In such a bottom emission structure, there is a problem that aperture ratio of a pixel is limited by a structure of a TFT circuit.

On the other hand, in the case of a structure in which an anode is formed on a substrate, an organic compound layer is formed on the anode, and a cathode as a transparent electrode is formed on the organic compound layer (hereinafter, the structure is referred to as a top emission), the aperture ratio of a pixel is larger than the bottom emission.

It is, however, difficult to arrange a drying agent over a pixel portion, or use an encapsulating can formed of materials that can shield a display light, since the drying agent or the encapsulating can disturbs the display in the top emission structure. Further, since the drying agent is highly hygroscopic, the drying agent requires careful handling and quick operation in sealing.

In the case of the top emission structure in which a substrate, with light-emitting elements formed thereupon, is bonded to a sealing substrate, a space over the pixel portion is filled and sealed with a first transparent sealing material in bonding the two substrates, and thus the whole pixel portion is covered with the sealing material, thereby suppressing diffusion of oxygen or water molecule into the element.

It is possible to employ a structure in which the first sealing material is surrounded by a second sealing material (having a higher viscosity than the first sealing material) that contains a gap material (filler, fine particles, or the like) for maintaining a space between the two substrates. At the time, the first sealing material and the second sealing material thus seal the light-emitting element.

There is, however, a fear that air bubbles spreading to the pixel portion will remain in corners when a seal pattern shape for the second sealing material is formed into a square shape, an inverted "c" shape, or a "U" shape, and the two substrates are bonded by dripping the first sealing material having low viscosity thereon.

Although the UV curing sealing method is suitable for sealing an element as described above, the seal pattern has a limitation, when there is a portion (such as a wiring portion of a TFT substrate or a sealing can) through which UV light cannot pass. Particularly, in the element in which a sealing substrate having a color filter is bonded to the top emission element, it is impossible to fill and seal the space over the pixel portion with UV curing sealing material, since neither a TFT substrate nor the sealing substrate having a color filter can transmit UV light. Even if the sealing substrate can transmit UV light, it is necessary to give extra consideration in order not to irradiate the EL layer with the UV light that is a high-energy line. In the top emission element in which the transparent electrode exists in a lower portion of the sealing material, the UV light reaches the EL layer, and thus the element is damaged.

SUMMARY OF THE INVENTION

It is an object of the present invention to prevent oxygen or moisture from reaching a pixel portion of a light-emitting device without being exposed to heat or UV light, prevent deterioration of the light-emitting element, and enhance the reliability. It is another object of the present invention to seal the light-emitting element with few steps without sealing a drying agent in.

The present invention employs a top emission structure in which a substrate, with light-emitting elements formed thereupon, is bonded to a sealing substrate. A first sealing material is applied to one of the substrate and the sealing substrate in such a way that a whole surface of a pixel portion is covered, when bonding the two substrates. A catalyst for curing the first sealing material is provided as a film for either a pixel portion or a region facing the pixel portion in the substrate to which the first sealing material is not applied. Then, a second sealing material (having higher viscosity than the first sealing material) including a gap material (such as filler or fine particles) for holding the space between the two substrates is applied to surround the first sealing material or the catalyst to cure the first sealing material. And the substrate and the sealing substrate are bonded together, thereby spreading the first sealing material over the whole surface of the pixel portion and having a contact with the catalyst, and starting to cure the first sealing material.

A pattern shape of the second sealing material is formed into a pattern (a line-shape or a spot-shape) having no bent portion without making the pattern shape into the square shape, the inverted "c" shape or the "U" shape. Opening portions are formed in the corners, which allow air bubbles to escape therethrough. By forming the opening portions, the first sealing material having low viscosity is pushed out in the direction of the opening portions in the corners when bonding the two substrates using the first sealing material having low viscosity. The pixel portion can be covered without mixing air bubbles thereinto. In addition, a pattern for the second sealing material having high viscosity may be slightly curved so that air bubbles may not be formed. The seal pattern of the second sealing material can be formed by other seal pattern forming method such as a printing method, as well as a dispenser device. Preferably, the substrate surface in which the catalyst is formed as a film is smooth and has superior levelness so that bubbles cannot mix thereinto.

The first sealing material starts to be cured by the contact with the catalyst, thus it is unnecessary to heat the element or irradiate the pixel portion with the UV light. An alicyclic epoxy rein, an aromatic epoxy resin, an aliphatic epoxy resin, etc. can be used as the sealing material that starts to be cured by the contact with the catalyst, and Lewis acid such as aluminum chloride(III), iron chloride(III), antimony pentachloride, aluminum bromide, titanium tetrachloride, tin tetrachloride, zinc chloride, copper chloride can be used as the catalyst.

When the substrates are bonded, the first sealing material is pushed and spreads to fill the space between the substrates. There is a case where a circumferential portion of the first sealing material will spread out from the opening portions, forming a bulging out shape (protruding shape), depending upon the viscosity of the first sealing material and the manner in which it is pushed out. There is also a case where the circumferential portion of the first sealing material will form a shape that enters into the inside of the opening portions. However, the first sealing material that spreads to a portion in which the catalyst is not formed as a film is cured so slowly. Namely, the second sealing material having high viscosity has a function of maintaining the space between the substrates by the gap material as well as adjusting the planar shape of the first sealing material having low viscosity. The catalyst that is formed into a pattern shape has also a function of controlling a progress of the curing reaction into a pattern shape.

The second sealing material can also serve as a mark when dividing the substrate. For example, the substrate may be divided along the second sealing material when manufacturing a plurality of panels on one substrate, that is, in the case of so-called multiple patterns. The first sealing material that protrudes from the region in which the catalyst is formed as a film is not cured, thus does not prevent the dividing.

Further, a location of maximum load applied when a shock is given from the outside can be set to the location of the second sealing material (only the second sealing material has the gap material) disposed outside of the pixel portion, and the load can be prevented from being applied to the pixel portion. Further, this is a structure in which the second sealing materials are each symmetrically disposed, and loads are applied uniformly to each with a good balance. Shocks from the outside can therefore be uniformly diffused. That is, a light-emitting device having an even more enhanced mechanical strength can be made according to the structure of the present invention.

The substrate, through which light emitted from the light-emitting elements passes, is preferably thin for the top emission structure. Thin substrates have a disadvantage, however, in that they have poor shock strength. Nonetheless, a light-emitting device capable of withstanding shocks from the outside can be made according to the present invention, even if a glass substrate or the like, which breaks relatively easily, is used as the substrate through which light emitted from the light-emitting elements passes. Further, there are no particular limitations placed on the transparent substrate to be used, and plastic substrates and the like can be used, for example. Substrates having the same thermal expansion coefficient are preferably used in order to maintain the adhesive strength as a pair of substrates.

The catalyst for curing the first sealing material can be formed as a film by vapor deposition or spin coating. Spin coating may be performed by dissolving the catalyst in water or organic solvent, or a polymer thin film including a catalyst may be formed by applying a solvent in which binder polymer and a catalyst are dissolved. Particularly, a vapor deposition using a mask is effective for forming a film selectively in a pixel portion or a region facing the pixel portion. The light-emitting element is sealed with the first sealing material, the second sealing material, and the substrate, thereby blocking effectively oxygen or moisture. The pair of substrates are bonded together preferably under reduced pressure or in a nitrogen atmosphere.

A structure described in the present invention is a method for manufacturing a light-emitting device comprising a pixel portion having a plurality of light-emitting elements including a first electrode, an organic compound layer that is in contact with the first electrode, a second electrode that is formed on the organic compound layer and that is in contact with the organic compound layer, between a pair of substrates, at least one of which has light transparency, comprising the step of:

bonding one substrate to which a first sealing material is applied and the other substrate in which a catalyst for curing the first sealing material is formed as a film together, covering the pixel portion with the first sealing material.

A method for manufacturing a light-emitting device, comprising the steps of:

forming a layer emitting electroluminescence on a first electrode formed on a first substrate in which a TFT is formed;

forming a second electrode;

forming a catalyst layer for curing a first sealing material;

applying the first sealing material onto a second substrate; and bonding the first substrate to the second substrate.

In the above described structure, a method for manufacturing a light-emitting device, comprising the step of:

forming the catalyst as a film so as to cover at least the pixel portion.

A method for manufacturing a light-emitting device, comprising the steps of:

forming a layer emitting electroluminescence on a first electrode formed on a first substrate in which a TFT is formed;

forming a second electrode;

applying a first sealing material;

forming a catalyst layer for curing the first sealing material on a second substrate; and bonding the first substrate to the second substrate.

In the above-described structure, a method for manufacturing a light-emitting device, comprising the steps of:

forming the catalyst as a film in such a shape that the catalyst can cover at least a whole surface of the pixel portion on the second substrate that does not have the pixel portion; and bonding the substrates so that a region in which the catalyst of the second substrate is formed may cover the pixel portion of the first substrate.

In the above-described structure, a method for manufacturing a light-emitting device, comprising the step of:

the catalyst is formed as a film by vapor deposition.

In the above-described structure, a method for manufacturing a light-emitting device, comprising the step of:

the catalyst is formed as a film by spin coating.

In the above-described structure, a method for manufacturing a light-emitting device, comprising the step of:

applying the first sealing material in such a way that the first sealing material spreads more widely than the region in which the catalyst is formed as a film in the step of bonding the first substrate and the second substrate.

In the above-described structure, a method for manufacturing a light-emitting device, comprising the step of:

applying the second sealing materials surrounding the pixel portion in such a way that the second sealing materials have opening portions in at least four corners, separately from the first sealing material covering the pixel portion.

In the above-described structure, a method for manufacturing a light-emitting device, comprising the step of:

applying the second sealing material having higher viscosity than that of the first sealing material.

In the above-described structure, a method for manufacturing a light-emitting device, comprising the step of:

forming a protective layer that has light transparency and includes $CaF_2$, $MgF_2$, or $BaF_2$ between the second electrode and the first sealing material.

In the above-described structure, a method for manufacturing a light-emitting device, comprising the steps of:

applying the first sealing material comprising an epoxy resin such as an alicyclic epoxy rein, an aromatic epoxy resin, an aliphatic epoxy resin; and forming a film using Lewis acid such as aluminum chloride (III), iron chloride(III), antimony pentachloride, aluminum bromide, titanium tetrachloride, tin tetrachloride, zinc chloride, copper chloride as the catalyst.

The light-emitting element (EL element) includes an organic compound layer that provides an electroluminescence generated by being applied with an electric field (hereinafter referred to as EL layer), an anode, and a cathode. The luminescence of the organic compound includes luminescence (fluorescence) generated when restoring from a singlet excitation state to the ground state and luminescence (phosphorescence) when restoring from a triplet excitation state to the ground state. The light-emitting device manufactured according to the present invention may be applied to both of the cases employing the two types luminescence described above.

A driving method of displaying a screen image is not particularly limited in the light-emitting device of the present invention. For example, a dot-sequential driving method, a line-sequential driving method, or a plane-sequential driving method can be used for the driving method. Typically, a line-sequential driving method is used and a time division gradation drive method or an area gradation drive method may appropriately be used. A video signal to be inputted to a source line of the light-emitting device may either be an analog signal or a digital signal, and thus a driver circuit or the like may appropriately be designed in accordance with the video signal.

DETAILED DESCRIPTION OF THE PREFERRED EMBODIMENTS

Embodiment Mode

Embodiment Modes of the present invention are described hereinafter.

[Embodiment Mode 1]

Figure 1A:
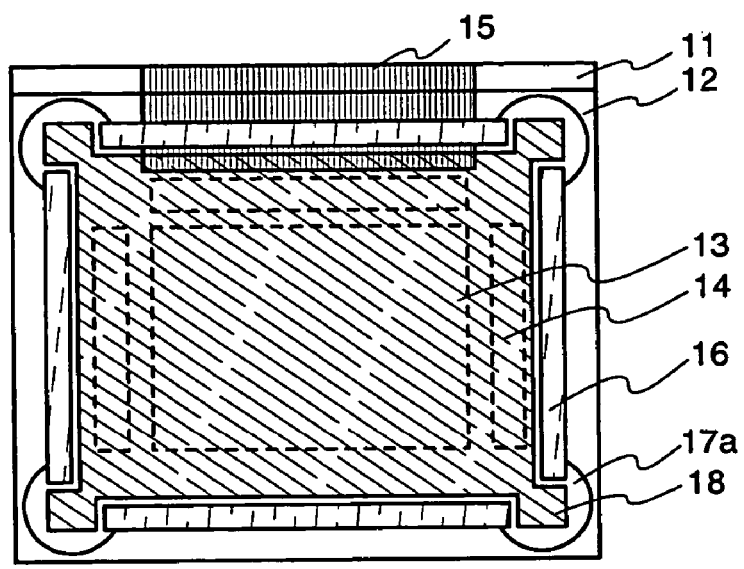
FIGS. 1A to 1C show Embodiment Mode 1.

FIG. 1A is a top view of an active matrix light-emitting device according to the present invention.

In FIG. 1A, reference numeral 11 denotes a first substrate, reference numeral 12 denotes a second substrate, reference numeral 13 denotes a pixel portion, reference numeral 14 denotes a driver circuit portion, reference numeral 15 denotes a terminal portion, reference numeral 16 denotes second sealing materials, reference numeral 17a denotes a first sealing material, and reference numeral 18 denotes a catalyst for curing the first sealing material.

There are no specific limitations placed on the material used for the first substrate 11. It is preferable, however, to use substrates having identical thermal expansion coefficients for the first substrate 11 and the second substrate 12 because the two substrates are bonded together. A substrate having light transparency, for example, a glass substrate, a quartz substrate, or a plastic substrate, is used for the first substrate 11 material when a bottom emission light-emitting device is manufactured. Further, a semiconductor substrate or a metallic substrate can also be used when a top emission light-emitting device is manufactured. The pixel portion 13, which has a plurality of light-emitting elements, the driver circuit portion 14, and the terminal portion 15 are provided for the first substrate 11.

Figure 1B:
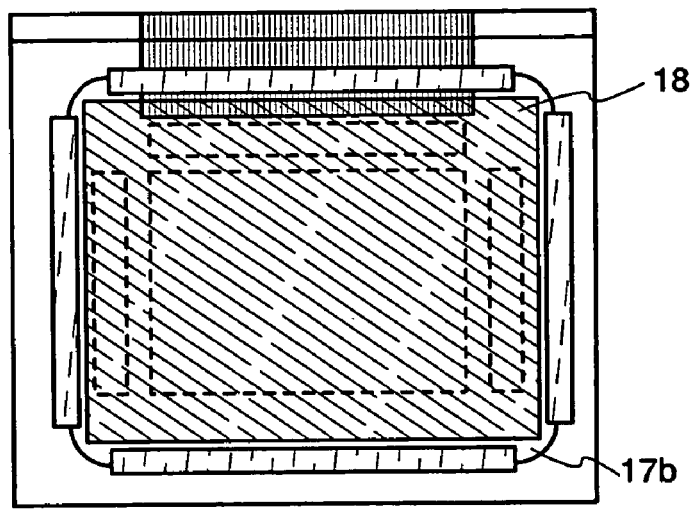
Figure 1C:
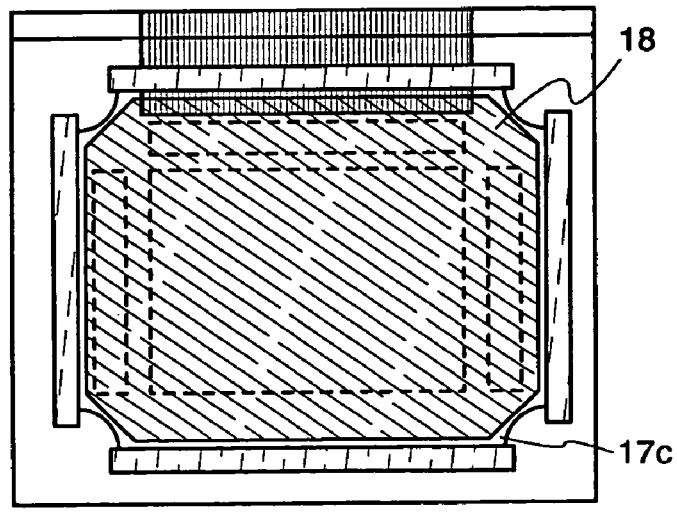

An example is shown here, in which the second sealing materials 16 are disposed to surround the pixel portion 13 and the driver circuit portion 14. Further, a portion of one of the second sealing materials 16 is overlapped with the terminal portion 15 (or a wiring that extends from a terminal electrode). Note that, the second sealing materials 16 contain a gap material in order to maintain a space between the pair of substrates. The second sealing materials 16 contain the gap material, and therefore, preferably, the second sealing materials 16 are not overlapped with elements (such as TFTs), so that shorts and the like do not occur when some type of load is imparted. Further, the shape of the top surface of the second sealing materials 16 is linear, and there are openings in four corners of the substrate as shown in FIGS. 1A to 1C. In other words, two of the second sealing materials 16 are disposed in parallel in an x-direction to sandwich the pixel portion therebetween, and another two of the second sealing materials 16 are disposed in parallel in a y-direction to sandwich the pixel portion therebetween. The total number of the first sealing materials disposed is four.

The first sealing material 17a is a colorless, transparent material and does not contain the gap material. The first sealing material, therefore, has higher light transparency than the second sealing materials 16. The first sealing material 17a is exposed in gaps, that is, opening portions between the second sealing materials 16, and has the top surface shape in which the circumference of the exposed first sealing material 17a is a curved shape.

Figure 2A:
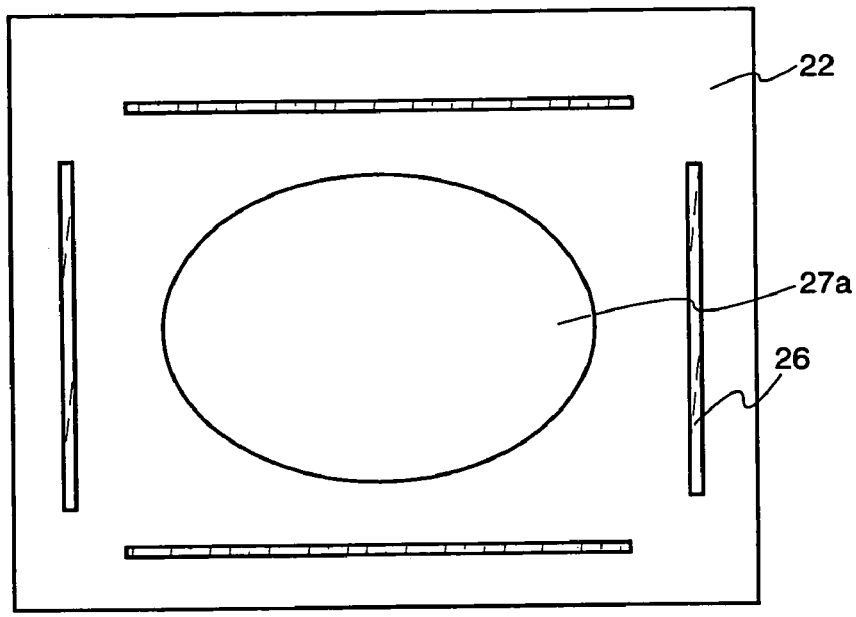
FIGS. 2A and 2B show Embodiment Mode 1.

A mechanism for the first sealing material 17a to take on the shape shown in FIG. 1A is described hereinafter with reference to FIGS. 2A and 2B. An example of a top view of a sealing substrate (a second substrate 22) before being bonded is shown in FIG. 2A. An example of forming a light-emitting device having one pixel portion from one substrate is shown in FIG. 2A.

Four second sealing materials 26 are formed first on the second substrate 22 by using a dispenser, and after that, a first sealing material having a lower viscosity than that of the second sealing material is dripped thereon. Note that, a top view of the second substrate with the first sealing material dripped thereon is shown in FIG. 2A. Then, a first substrate, on which a pixel portion 23 provided with a light-emitting element, or a driver circuit portion 24, and a terminal portion 25 are formed, is bonded to the second substrate. A top view of the substrates immediately after bonding the pair of substrates is shown in FIG. 2B. The viscosity of the second sealing material is high, and therefore it hardly spreads out upon bonding. The viscosity of the first sealing material is low, however, and the first sealing material spreads out planarly upon bonding, as shown in FIG. 2B. The first sealing material is pushed out between the second sealing materials 26, that is, toward an opening portion in the direction shown by an arrow in FIG. 2B. Air bubbles can thus be kept from existing in a region to be filled between the second sealing materials 26 by the first sealing material. The second sealing material 26 is not mixed with a first sealing material 27b, even if there is a contact therebetween, and the second sealing material 26 has a viscosity such that the position at which it is formed is not changed by the first sealing material 27b.

Figure 2B:
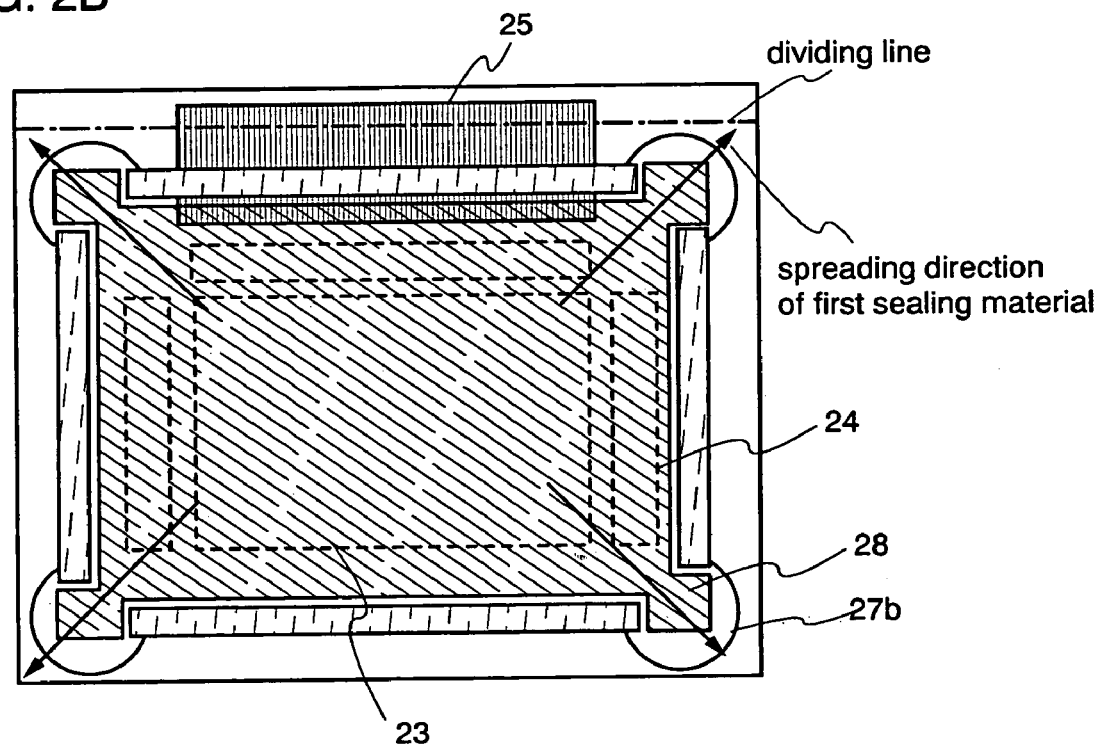

The first sealing material 27b is exposed in the openings in FIG. 2B, and the circumference of the exposed first sealing material 27b protrudes out from the openings. The distance between the ambient atmosphere and the pixel portion can be made longer by the first sealing material 27b protruding out from the openings, and in addition, oxygen and moisture can be blocked out. The total contact surface area is also increased, and therefore the bonding strength also increases. The circumference of the first sealing material 27b is curved in the openings.

The first sealing material begins to be cured gradually because of the contact with the catalyst that is formed as a film on the first substrate, when the first substrate is bonded. On the contrary, the second sealing material 26 is cured by being irradiated with ultraviolet rays while protecting the pixel portion with a light-shielding mask.

Note that an example of bonding the substrates after forming the first sealing material or the second sealing materials on the second substrate 22 is shown here, but the present invention is not limited to this structure in particular. The first sealing material or the second sealing materials may also be formed on the first substrate on which elements are formed. It should be noted that, in that case, the catalyst is formed as a film on the second substrate.

A portion of the second substrate 22 is divided next. The line shown by a dashed line in FIG. 2B is a substrate dividing line. The dividing line may be set in parallel with the second sealing materials 26 formed on the terminal portion 25 in dividing.

The shape of the first sealing material 17a shown in FIG. 1A can thus be obtained in accordance with the procedures shown above.

Further, although an example in which the first sealing material 17a protrudes out from the openings is shown in FIG. 1A, various other shapes can also be made by suitably changing the viscosity, the amount, or the material of the first sealing material.

For example, a first sealing material 17b may be exposed in the openings, and the circumference of the exposed first sealing material may be curved as shown in FIG. 1B. The first sealing material does not protrude out from the openings in FIG. 1B. The circumference of the first sealing material takes on a shape such that gaps of the second sealing materials can be filled, while tracing an arc.

A first sealing material 17c may be exposed in the openings, and the circumference of the exposed first sealing material may be curved, depressed inwardly from the opening portions, as shown in FIG. 1C.

Figure 6:
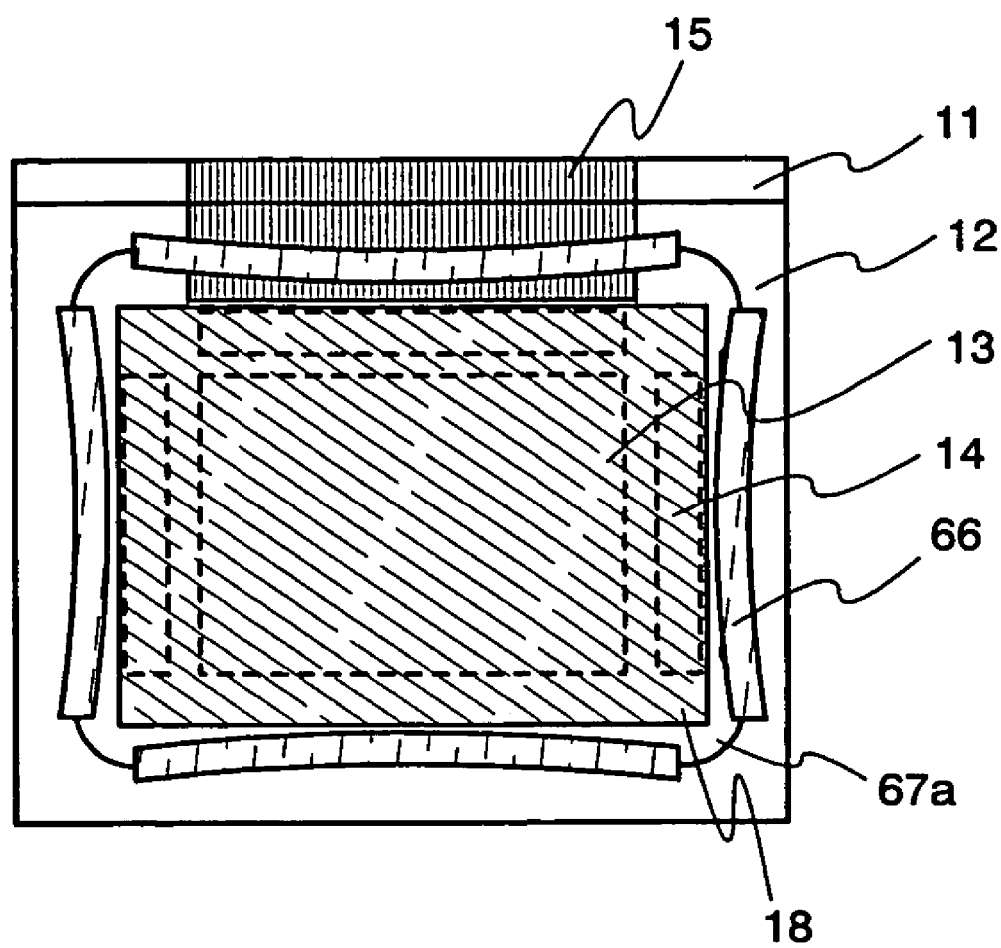
FIG. 6 shows Embodiment Mode 1.

Further, the second sealing materials are not limited to a linear shape, provided that they are bilateral symmetrical and that they are disposed symmetrically to sandwich the pixel portion therebetween. For example, the shape of the second sealing materials 66 may be curved slightly so that the first sealing material 67a having low viscosity can spread out easily in bonding, as shown in FIG. 6.

[Embodiment Mode 2]

Figure 3A:
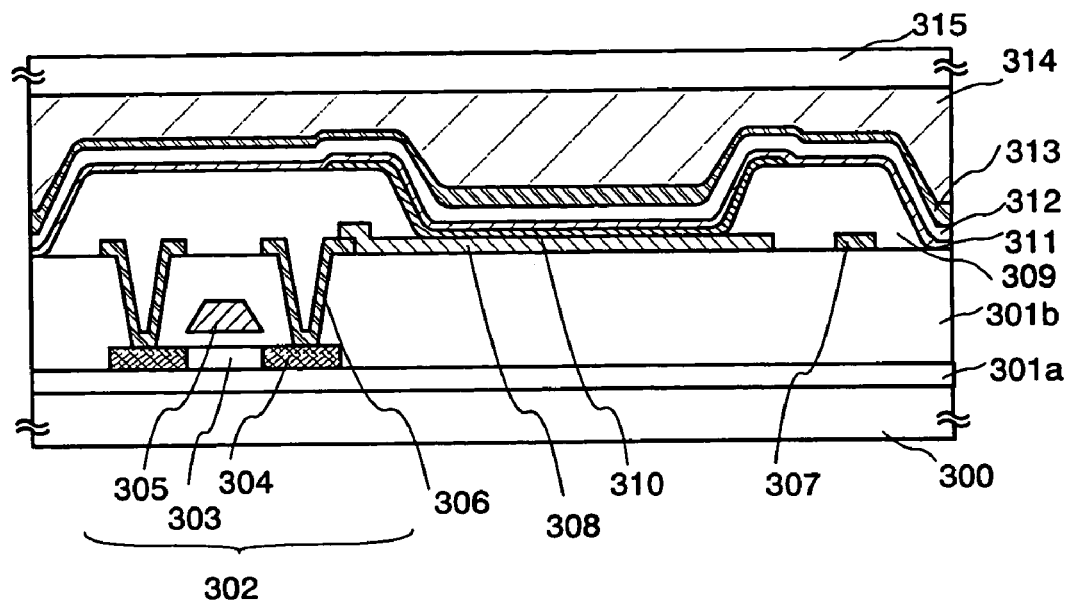
FIGS. 3A and 3C show Embodiment Mode 2.
Figure 3B:
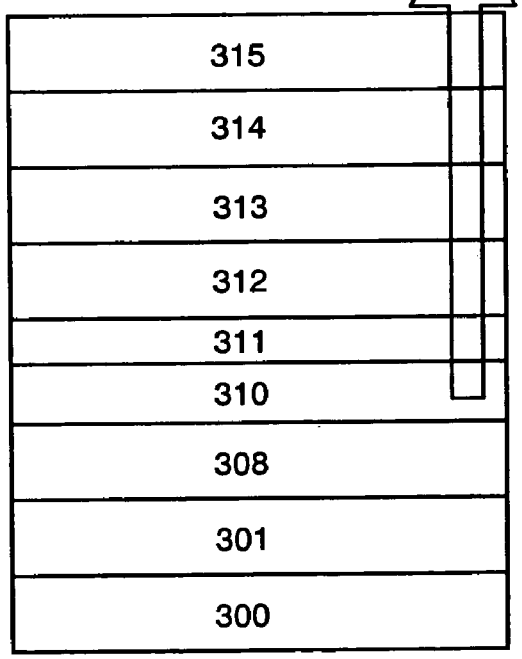
Figure 3C:
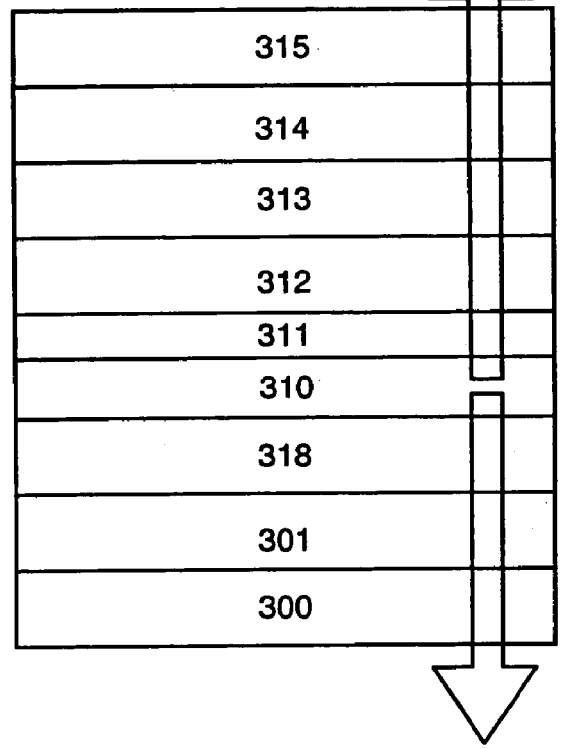

A portion of a cross sectional structure of a pixel portion of the present invention is shown here in FIGS. 3A to 3C.

(First Substrate)

In FIG. 3A, reference numeral 300 denotes a first substrate, reference numerals 301a and 301b denote insulating layers, reference numeral 302 denotes a TFT, reference numeral 308 denotes a first electrode, and reference numeral 309 denotes an insulator. Reference numeral 310 denotes an EL layer, reference numeral 311 denotes a second electrode, reference numeral 312 denotes a transparent protective layer, reference numeral 313 a catalyst layer, reference numeral 314 denotes a first sealing material, and reference numeral 315 denotes a second substrate.

(TFT Structure)

The TFT 302 (p-channel TFT) formed on the first substrate 300 is an element for controlling current flowing in the light-emitting EL layer 310, and reference numeral 304 denotes a drain region (or a source region) thereof. Further, reference numeral 306 denotes a drain electrode (or a source electrode) that connects a first electrode and the drain region (or the source region). Further a wiring 307 such as an electric power supply line or a source wiring is formed at the same time as the drain electrode 306 in the same process. An example in which the first electrode and the drain electrode are formed separately is shown here, but they may also be formed at the same time. An insulating layer 301a that is a base insulating film (a nitride insulating film as a lower layer thereof, and an oxide insulting film as an upper layer thereof here) is formed on the first substrate 300. A gate insulating film is formed between a gate electrode 305 and an active layer. Further, reference numeral 301b denotes an interlayer insulating film made from an organic material or an inorganic material. Further, although not shown here, an additional TFT (n-channel TFT or p-channel TFT), or a plurality of TFTs, may also be formed in one pixel. Although a TFT having one channel forming region 303 is shown here, the present invention is not limited in particular to this, and a TFT having a plurality of channels may also be used.

(Anode)

Further, the reference numeral 308 denotes a first electrode, that is, an anode (or a cathode) of an OLED. A film of an element selected from the group consisting of Ti, TiN, TiSi$_x$N$_y$, Ni, W, WSi$_x$, WN$_x$, WSi$_x$N$_y$, NbN, Mo, Cr, Pt, Zn, Sn, In, and Mo, or a film of an alloy material or a chemical compound material including one of these elements as its main constituent, or a laminate of such films at a total film thickness in a range of 100 nm to 800 nm may be used as a material for the first electrode 308. A pretreatment such as a UV ozone treatment is preferably performed before forming an organic layer.

For example, when a titanium nitride film is used for the first electrode 308, ultraviolet radiation or plasma treatment using chlorine gas may preferably be performed on the surface thereof to increase the work function.

An ITO (indium tin oxide) that is excellent in a hole-injecting characteristics and transparent is used for the anode of the bottom emission element or a dual-emission element (light emitted from opposite sides of a substrate). When the ITO is used for the anode of the top emission element, an ITO film is formed over a metal film such as Al—Si (350 nm)/Ti (100 nm) to form a reflecting electrode. Light reflected off the reflecting electrode and direct light are interfered by each other in the light-emitting region, thereby changing the strength or the spectrum. A phase of the reflected light depends on a thickness of the ITO, and thus it is necessary to carefully design the thickness of the ITO according to emission wavelength in order to enhance light emitting efficiency. Particularly, an ultrathin ITO that is about 20 nm in thickness is preferably used for showing a flat light-extracting property in the visible light region, in the case of extracting white color luminescence.

(Bank)

Further, the insulator 309 (also referred to as a bank, a partition wall, a barrier, an embankment, and the like) covers an edge portion of the first electrode 308 (and the wiring 307). Inorganic materials (such as silicon oxide, silicon nitride, and silicon oxynitride), photosensitive organic materials and non-photosensitive organic materials (such as polyimide, acrylic, polyamide, polyimide amide, resist, and benzocyclobutene), laminates of these materials, or the like can be used as the insulator 309. A photosensitive organic resin covered with a silicon nitride film is used here. It is preferable to provide a curved surface having a radius of curvature only with an upper edge portion of the insulator in the case of using a positive type photosensitive acrylic as the organic resin material, for example. Further, negative type photosensitive organic materials which become insoluble in etchant by photosensitive light, and positive type photosensitive organic materials which become soluble in etchants by light, can be used as the insulator.

(Organic Layer)

An organic compound layer 310 (a layer containing organic compound) is formed by using a vapor deposition method or an application method. Note that it is preferable to remove attached water molecules and the like by performing vacuum heat treatment before forming the organic compound layer 310, in order to improve the reliability. For example, when the vapor deposition method is used, vapor deposition is performed in a film formation chamber that has been vacuum-evacuated to a pressure equal to or less than $5 \times 10^{-3}$ Torr (0.665 Pa), preferably between $10^{-6}$ and $10^{-4}$ Pa. The organic compound is gasified in advance by resistance heating in vapor deposition, and is dispersed toward the substrate by opening a shutter at the time of vapor deposition. The gasified organic compound is dispersed upward, and is deposited on the substrate after passing through an opening portion formed in a metal mask.

(Low-Molecular Element)

For example, a hole injection layer is formed of 20 nm thick copper phthalocyanine, and a hole transporting layer is formed by doping a blue light-emitting material perylene to 30 nm thick α-NPD. Further, an electron transporting layer is formed by doping a red light-emitting element DCM-1 to 500 nm thick BAlq. White color luminescence can be obtained by sequentially laminating in this way.

(High-Molecular Element)

When the organic compound layer is formed by an application method performing spin coating, it is preferable to bake the layer by using vacuum heat treatment after being applied. For example, an aqueous solution of poly-(ethylene dioxythiophene) and poly-(styrene sulfonic acid) (PEDOT/PSS), which serves as a hole injecting layer, may be applied over the entire surface and baked. A solution of polyvinylene carbazole (PVK) doped with a luminescence center pigment (such as 1,1,4,4-tetraphenyl-1,3-butadiene(TPB), 4-dicyanomethylene-2-methyl-6-(p-dimeth ylamino-styryl)-4H-pyran (DCM1), Nile red, Coumarin 6), which serves as a light-emitting layer, may then be applied over the entire surface and baked. Note that water is used as a solvent for PEDOT/PSS, which does not dissolve in organic solvents. Consequently, there is no danger of re-dissolution when PVK is applied thereupon. Further, the solvents used for PEDOT/PSS and PVK are different, and therefore the same film formation chamber is preferably not used for both. Furthermore, the organic compound layer 310 can be formed as a single layer, and 1,3,4-oxadiazole derivative (PBD), which has electron transporting characteristics, may be dispersed in polyvinyl carbazole (PVK), which has hole transporting characteristics. In addition, white color luminescence can be obtained by dispersing 30 wt % of PBD as an electron transporting agent, and dispersing a suitable amount of four types of pigments (TPB, Coumarin 6, DCM1, and Nile red).

(Cathode)

Further, reference numeral 311 denotes the second electrode made from a conductive film, that is, a cathode (or anode) of an OLED. A metal such as aluminum, magnesium or silver, a film of an alloy such as MgAg, MgIn, AlLi, or a film having light transparency and formed by co-vapor deposition of aluminum or silver with an element residing in group 1 or group 2 of the periodic table, may be used as a material for the second electrode 311. When the cathode is formed, the cathode is selectively formed using a vapor deposition mask by resistance heating due to the vapor deposition. Alternatively, a transparent electrode such as ITO may be formed by sputtering. The ITO can be used by itself, or with the metal film having light transparency.

A top emission type light-emitting device that emits light that passes through the second electrode is manufactured here, and thus a 1 nm to 30 nm thick silver film is used. In order to enhance electron-injecting characteristics from the silver thin film, under the second electrode is formed a 1 nm to 20 nm electron injection layer in which the amount of 0.1 mol to 10 mol of an element in group 1 (such as Li) or an element in group 2 (such as Mg) is vapor-deposited onto copper phthalocyanine, BCP, Alq$_3$, or the like.

Further, a supplemental electrode may also be formed on the second electrode 311, that is a region that is not a light-emitting region, in order to make the cathode have lower resistance.

(Protective Layer)

Reference numeral 312 denotes the transparent protective layer formed by vapor deposition, which protects the second electrode 311 that is made from a metal thin film.

For example, a catalyst for curing an epoxy resin is Lewis acid such aluminum chloride, but there is a risk that the second electrode 311 is easily deteriorated, when the catalyst is formed on the second electrode 311 made of an ultrathin metal film.

The second electrode 311 is covered with the transparent protective layer 312, for example, $CaF_2$, $MgF_2$, or $BaF_2$, thereby making it possible to prevent the second electrode 311 from reacting with a catalyst 313 for curing the first sealing material. Oxygen and moisture can also be effectively blocked out at the same time.

Further, it is possible to form $CaF_2$, $MgF_2$, and $BaF_2$ by vapor deposition. Impurity mixing-in, or exposure of the electrode surface to the ambient atmosphere can be prevented by forming the cathode and the transparent protective layer in succession by using vapor deposition. In addition, the transparent protective layer 312 can be formed while imparting almost no damage to the organic compound layer if vapor-deposition is used.

(Catalyst)

The catalyst layer 313 has a contact with the sealing material 314, and causes a curing reaction. The catalyst layer 313 is formed over the transparent protective layer 312 by vapor deposition or spin coating. For example, Lewis acid such as aluminum chloride(III), iron chloride(III), is vapor-deposited as a film in a thickness of from 1 nm to 1000 nm, preferably, 5 nm to 500 nm by vapor deposition as the transparent protective layer 312.

(Sealing Material)

The second substrate 315 is bonded to the first substrate 300 by the first sealing material 314 according to the method shown in Embodiment Mode 1. There are no particular limitations placed on the material for the first sealing material 314 that can start curing by a contact with the catalyst, as long as the sealing material has light transparency. Typically, an alicyclic epoxy rein, an aromatic epoxy resin, an aliphatic epoxy resin, etc. can be used. A photo-oxidation generating material that generates Lewis acid by irradiation of ultraviolet rays, and the sealing material that can start to cure by ultraviolet irradiation may be employed as well as catalyst. A highly heat resistant UV epoxy resin (product name: 2500 Clear, manufactured by Electrolite Cooperation) having an index of refraction equal to 1.50, a viscosity equal to 25 Pa·s, a Shore D hardness equal to 90, a tensile strength equal to 3,000 psi, a Tg point of 150° C., a volumetric resistivity equal to $1\times10^{15}$ Ω·cm, and a withstand voltage of 450 V/mil is used here.

(Second Substrate)

The second substrate 315 may be a plastic substrate as well as a glass substrate or a quartz substrate, as long as the substrate has light transparency. A color filter can be formed on the second substrate 315.

(Direction of Light-Emitting)

A simplified form of the laminate structure in the light-emitting region is shown in FIG. 3B. Emitted light is discharged in the direction which the arrow shows in FIG. 3B.

Further, emitted light can be discharged from both the top surface and the bottom surface when a first electrode 318 made from a transparent conductive film as shown in FIG. 3C is used as a substitute for the first electrode 308 made from a metal layer. ITO (indium tin oxide alloy), an alloy of indium oxide and zinc oxide ($In_2O_3$, —ZnO), zinc oxide (ZnO), and the like may be used as the transparent conductive film.

This embodiment mode can be freely combined with Embodiment Mode 1.

[Embodiment Mode 3]

A case of forming a plurality of pixel portions on one substrate, that is, an example of multiple patterns, is shown in FIGS. 4A to 4E. An example of forming four panels using one substrate is described hereinafter.

Figure 4A:
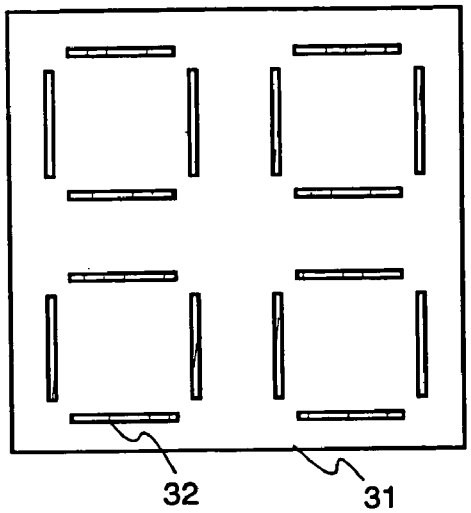
FIGS. 4A to 4E show Embodiment Mode 3.

Second sealing materials 32 are formed in a predetermined location on a second substrate 31 by a dispenser in an inert gas atmosphere (FIG. 4A). A material that contains a filler (diameter 6 μm to 24 μm) and has a viscosity of 370 Pa·s is used as a material for the semi-transparent second sealing materials 32. The second sealing material 32 can be formed by a printing method because it has a simple sealing pattern.

Figure 4B:
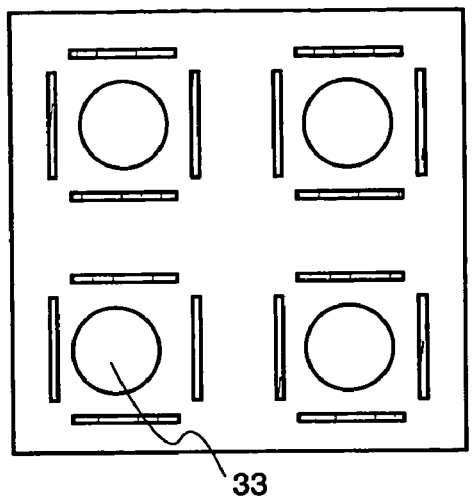

Next, a transparent first sealing material 33 is dripped on the region surrounded by the second sealing materials 32 (with openings in four corners) (FIG. 4B). A highly heat resistant UV epoxy resin added with a photo-oxidation generating material (product name: 2500 Clear, manufactured by Electrolite Cooperation) having an index of refraction of 1.50 and a viscosity of 25 Pa·s is used here.

Figure 4C:
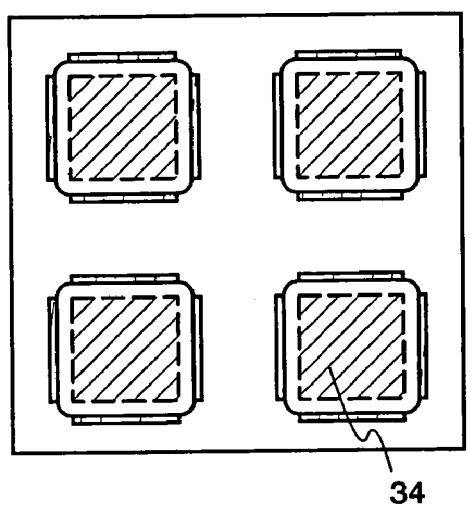

The first substrate on which pixel portions 34 are formed is bonded to the substrate on which the sealing materials are formed (FIG. 4C). Note that it is preferable to perform annealing in a vacuum immediately before bonding the pair of substrates by using the sealing materials, thereby performing degasification. The first sealing material 33 spreads out so as to form a shape like that shown in FIG. 1B, to fill a gap between the second sealing materials 32. At the same time, the first sealing material 33 has a contact with the catalyst, thereby starting a curing reaction. Depending upon the shape and the arrangement of the second sealing materials 32, the first sealing material 33 can fill the gaps without the introduction of air bubbles.

The pixel portion is provided with light by using a light-shielding mask in order not to be irradiated with light, and circumferences of the second sealing materials 32 and the first sealing material 33 are irradiated with ultraviolet light and cured.

Figure 4D:
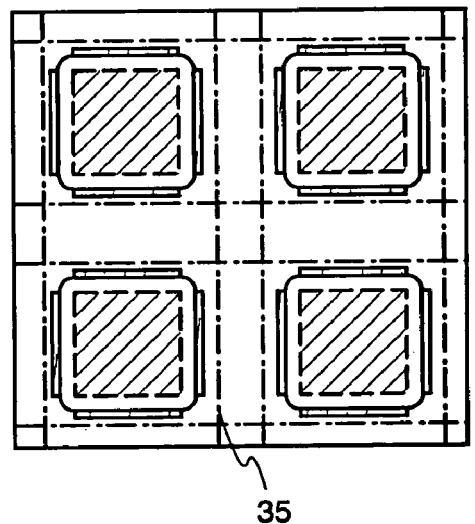

Scribe lines 35, shown by dashed lines, are formed next by using a scriber apparatus (FIG. 4D). The scribe lines 35 may be formed along the second sealing materials.

Figure 4E:
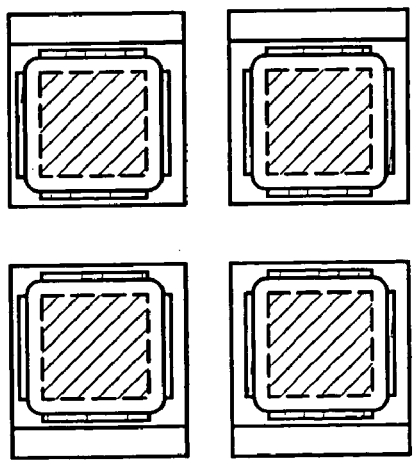

The substrate is divided using a breaker apparatus (FIG. 4E). Four panels can thus be manufactured from one substrate.

Further, this embodiment mode can be freely combined with Embodiment Mode 1 or Embodiment Mode 2.

The present invention including the above structures is described in detail in Embodiments below.

Embodiments

[Embodiment 1]

Figure 5A:
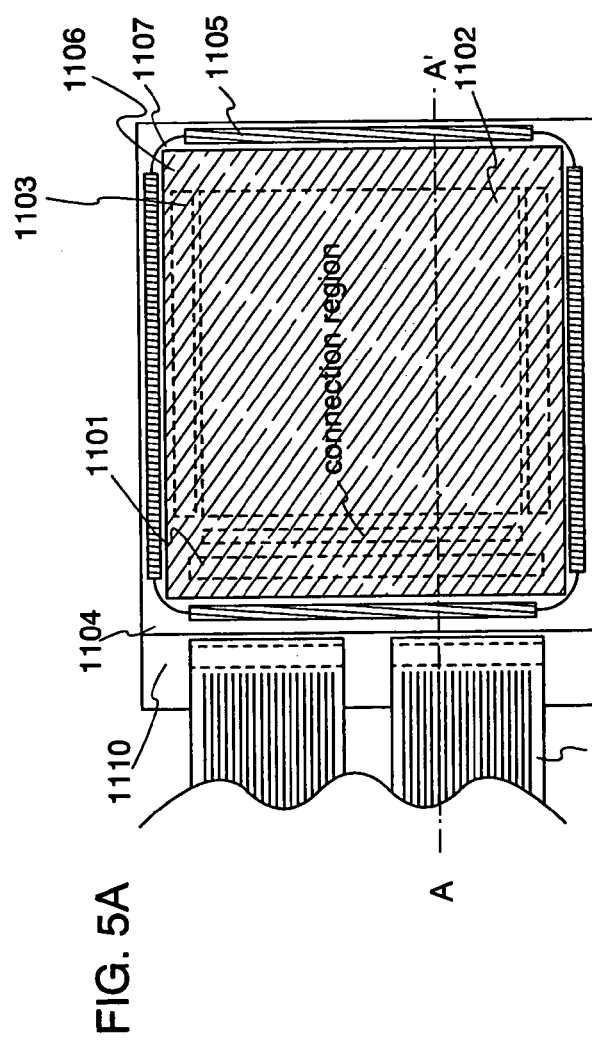
FIGS. 5A and 5B show a structure of an active matrix light-emitting device (Embodiment 1)
Figure 5B:
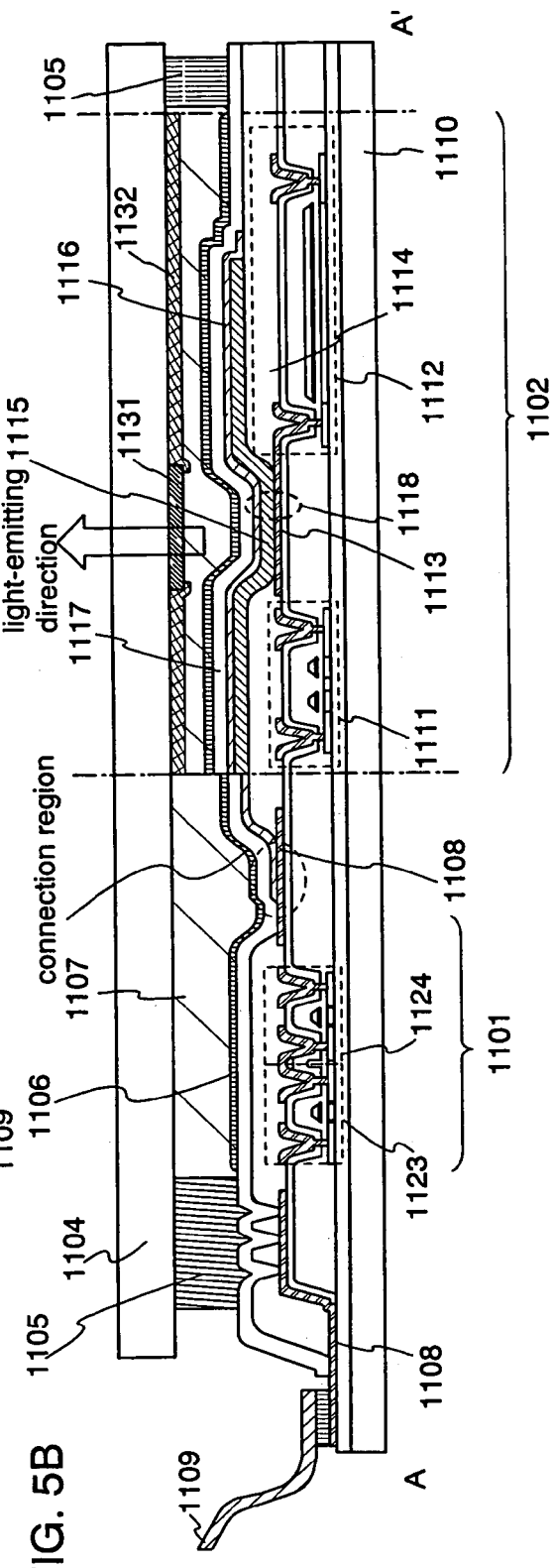

One example of a light-emitting device that has a light-emitting element including an organic compound layer as a light-emitting layer is described in this embodiment with reference to FIGS. 5A and 5B.

FIG. 5A is a top view of a light-emitting device and FIG. 5B is a cross-sectional view of FIG. 5A taken along the line A–A'. A dotted line 1101 is a source signal line driver circuit, 1102 is a pixel portion, and 1103 is a gate signal line driver circuit. Reference numeral 1104 is a sealing substrate and 1105 is a second sealing material. The inside surrounded by the second sealing material 1105 is filled with a first transparent sealing material 1107. Reference numeral 1106 is a catalyst for curing the first sealing material. The first sealing material 1107 is exposed at four corners.

Reference numeral 1108 is a wiring for transmitting signals inputted to the source signal driver circuit 1101 and the gate signal line driver circuit 1103, and receives a video signal and a clock signal from FPC (flexible print circuit) 1109 that is an external input terminal. Though only FPC is shown here, a print wiring board (PWB) may be attached to the FPC. A light-emitting device in this specification includes not only a light-emitting device body but also a light-emitting device to which FPC or PWB is attached.

Next, the cross sectional structure is described with reference to FIG. 5B. A driver circuit and a pixel portion are formed on the substrate 1110. Here, the source signal line driver circuit 1101 as a driver circuit and the pixel portion 1102 are shown.

CMOS circuit is formed as the source signal line driver circuit 1101 by combining an n-channel TFT 1123 and a p-channel TFT 1124. The TFT forming a driver circuit may be formed of known CMOS circuit, PMOS circuit, or NMOS circuit. This embodiment shows a built-in driver in which a driver circuit is formed on a substrate, but not always limited thereto. The driver circuit can be formed not on the substrate but at exterior portion thereof.

The pixel portion 1102 comprises a plurality of pixels including a switching TFT 1111, a current control TFT 1112, and a first electrode (anode) 1113 connected electrically to a drain of the current control TFT 1112.

Since the first electrode 1113 has directly a contact with the drain of the TFT, the bottom layer of the first electrode 1113 is preferably a material layer that is made of silicon and that can have an ohmic contact with the drain. The surface that is in contact with an organic compound layer is a material layer that has a large work function.

An insulator (referred to as a bank, a partition wall, a barrier, mount, or the like) 1114 is formed on each end of the first electrode (anode) 1113. The insulator 1114 may be made from an organic resin film or an insulating film containing silicon. Here, a positive photosensitive acrylic resin film is used as the insulator 1114, thereby forming the insulator having a shape shown in FIG. 5B. The insulator 1114 may be covered with a protective film made from an aluminum nitride film, an aluminum nitride-oxide film, or a silicon nitride film. The protective film is an insulating film that includes silicon nitride or silicon nitride-oxide as its main constituent by sputtering (such as DC sputtering or RF sputtering), or a thin film that includes carbon as its main constituent. When a silicon target is used for forming the protective film in an atmosphere containing nitride and argon, a silicon nitride film can be formed. Alternatively, a silicon nitride target may also be used. The protective film can be formed by using a film-formation device using remote plasma. The thickness of the protective film is preferably formed to be as thin as possible so that light can pass through the protective layer.

An organic compound layer 1115 is selectively formed on the first electrode (anode) 1113 by vapor deposition using a vapor-deposition mask or by ink-jet. A second electrode (cathode) 1116 is formed on the organic compound layer 1115. Therefore, a light-emitting element 1118 including the first electrode (anode) 1113, an organic compound layer 1115, and the second electrode (cathode) 1116 can be formed. Since an example that the light-emitting element emits white color luminescence is shown here, a color filter formed from a coloring layer 1131 and BM 1132 (for simplification, an over coat layer is not shown) is provided.

If organic compound layers that can obtain R, G, B luminescence are each formed selectively, full color display can be realized without color filter.

For the sake of sealing the light-emitting element 1118 formed on the substrate 1110, the sealing substrate 1104 is bonded by using a second sealing material 1105 and a first sealing material 1107. An epoxy resin is preferably used for the second sealing material 1105 and the first sealing material 1107. Moisture and oxygen preferably penetrate the second sealing material 1105 and the first sealing material 1107 as little as possible.

In this embodiment, a plastic substrate made from FRP (Fiberglass-Reinforced Plastics), PVF (polyvinylfluoride), Mylar, polyester, acrylic, or the like can be used for the sealing substrate 1104 besides a glass substrate or a quarts substrate. After the sealing substrate 1104 is bonded using the second sealing material 1105 and the first sealing material 1107, a third sealing material can be used for sealing the sealing substrate 1104 to cover the side face (exposed face).

As described above, without exposing the pixel portion to heat or UV light, the light-emitting element is sealed by the second sealing material 1105 and the first sealing material 1107, thereby shutting out the light-emitting element absolutely from the outside and preventing moisture and oxygen that cause deterioration of an organic compound layer from penetrating thereinto. Therefore the very reliable light-emitting device can be manufactured.

This embodiment can be freely combined with any one of Embodiment Modes 1 to 3.

[Embodiment 2]

Figure 7A:
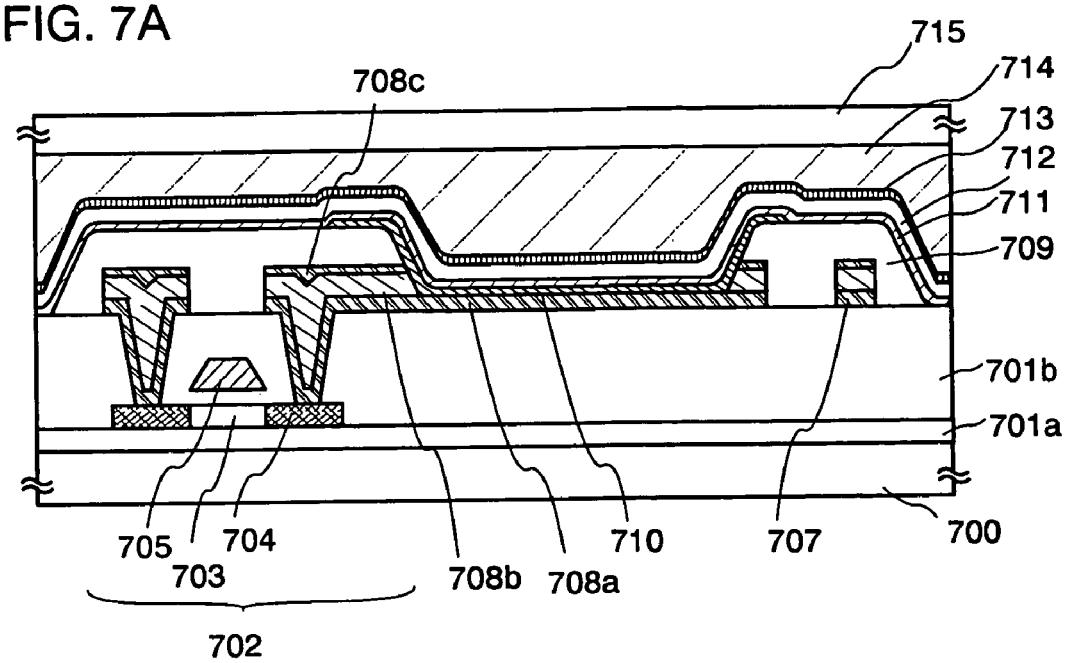
FIGS. 7A and 7B show Embodiment 2.
Figure 7B:
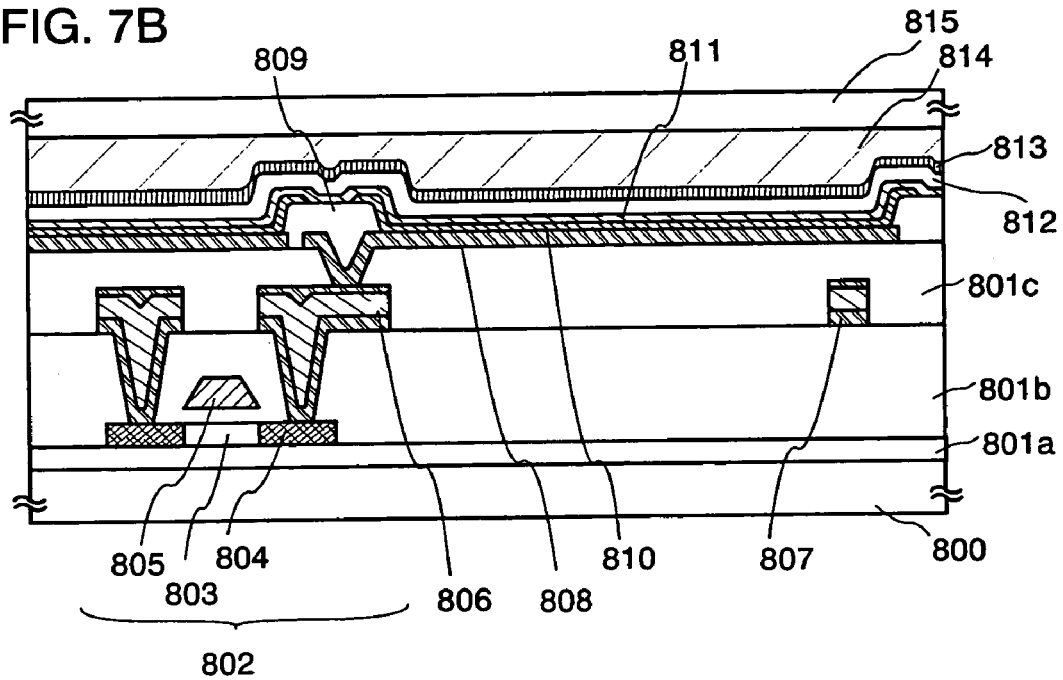

In this embodiment, a different cross-sectional structure from that of Embodiment Mode 2 is shown in FIGS. 7A and 7B.

In FIG. 7A, reference numeral 700 denotes a first substrate, reference numerals 701*a* and 701*b* are insulating layers, reference numeral 702 denotes a TFT, reference numeral 709 denotes an insulator, reference numeral 710 denotes an EL layer, reference numeral 711 denotes a second electrode, reference numeral 712 denotes a transparent protective layer, reference numeral 713 denotes a catalyst layer, reference numeral 714 denotes a first sealing material, and reference numeral 715 denotes a second substrate.

A TFT 702 (p-channel TFT) formed on a first substrate 700 is an element for controlling current that is flowing through the EL layer 710 to emit light. Reference numeral 704 is a drain region (or a source region). Though not shown here, another TFT (n-channel TFT or p-channel TFT) or plural TFTs are provided for one pixel. Here, a TFT having one channel forming region 703 is illustrated, but not limited thereto, the TFT may have a plurality of channels.

FIG. 7A shows a structure in which a first electrodes 708*a* to 708*c* made of a laminate of metal layers are formed, then, after an insulator 709 (also referred to as a bank, barrier, or the like) for covering each end of the first electrode is formed, etching is conducted in a self-aligning manner using the insulator 709 as a mask, and then, a center portion of the first electrode is etched thinly to form steps at each end thereof as well as to etch a part of the insulator. By this etching, the center portion of the first electrode is made thin and flat, and each end of the first electrode covered with the insulator is made thick, that is, a concave shape. Then, the organic compound layer 710 and the second electrode 711 are formed on the first electrode to complete the light-emitting element.

The structure shown in FIG. 7A is one for increasing an amount of light emission that is extracted in a certain direction (toward the second electrode to be passed through) by reflecting or condensing the emitted light in the lateral direction in a slope formed in the step portions of the first electrode.

Thus, a slope portion 708*b* is preferable to be made from a metal that reflects light, for example, a material including aluminum or silver as its main constituent. A center portion 708*a* having a contact with the organic compound layer 710 is preferably an anode material having a large work function or a cathode material having a small work function. Since a wiring 707 such as a power supply line or a source wiring is formed simultaneously, and thus a material having low resistance is preferably selected.

An angle of gradient (also referred to as a taper angle) in the slope toward the center portion of the first electrode is preferably set in the range of from 50° to 60°, preferably, 54.7°. It is necessary to set appropriately the angle of gradient, a material and thickness of the organic compound layer, or a material and a thickness of the second electrode so that the light reflected by the slope of the first electrode may not be dispersed or strayed between layers.

In this embodiment, reference numeral 708*a* is a laminate of titanium film (60 nm in thick) and a titanium nitride film (100 nm thick), 708*b* is an aluminum film (350 nm thick) containing trace of Ti, and 708*c* is a titanium film (100 nm thick). The 708*c* protects 708*b* from hillock or deterioration of the aluminum film. Alternatively, a titanium nitride film may be used as 708*c* to give it light shielding property and prevent reflection of an aluminum film. A titanium film is used for the bottom layer of 708*a* so that 708*a* can have a good ohmic contact with 704 made from silicon, however, this is not limited thereto, another metal film can be used. 708*a* can be formed of a single layer of a titanium nitride film.

UV treatment or plasma treatment is required to be performed because a titanium nitride film is used as an anode in this embodiment. However, plasma treatment is performed on a surface of the titanium nitride film at the same time as performing etching on 708*b* and 708*c*, thereby obtaining a large enough work function as an anode.

An element selected from the group consisting of: Ni, W, $WSi_x$, $WN_x$, $WSi_xN_y$, NbN, Mo, Cr, Pt, Zn, Sn, In, or Mo, a film of an alloy material or a chemical compound material including one of these elements as its main constituent, or a laminate of such films at a total film thickness in a range of 100 nm to 800 nm may be used as the material of the anode, instead of the titanium nitride film.

In the structure shown in FIG. 7A, since etching is conducted in a self-aligning manner using the insulator 709 as a mask, there is no need to add more masks. Thus a top emission type light-emitting device can be manufactured with few masks and steps in total.

FIG. 7B shows a different structure from that of FIG. 7A. In the structure shown in FIG. 7B, an insulating layer 801*c* is used as an interlayer insulating film, and the first electrode and a drain electrode (or a source electrode) are provided for different layers. Consequently, although the number of masks increases, the light-emitting area can be enlarged.

In FIG. 7B, reference numeral 800 denotes a first substrate, reference numerals 801*a*, 801*b*, and 801*c* are insulating layers, reference numeral 802 denotes a TFT (a p-channel TFT), reference numeral 803 denotes a channel forming region, reference numeral 804 denotes a drain region (or a source region), reference numeral 805 denotes a gate electrode, reference numeral 806 denotes a drain electrode (or a source electrode), reference numeral 807 denotes a wiring, reference numeral 808 denotes a first electrode, reference numeral 809 denotes an insulator, reference numeral 810 denotes an EL layer, reference numeral 811 denotes a second electrode, reference numeral 812 denotes a transparent protective layer, reference numeral 813 denotes a catalyst layer, reference numeral 814 denotes a first sealing material, and reference numeral 815 denotes a second substrate.

When a transparent conductive film is used as the first electrode 808, dual emission (both top and bottom emissions) type light-emitting device can be manufactured.

This embodiment can be freely combined with any one of Embodiment Modes 1 to 3, and Embodiment 1.

[Embodiment 3]

All of electronic apparatuses incorporating a module (active matrix EL module, passive matrix EL module) including an organic compound layer are completed according to the present invention.

A video camera, a digital camera, a head mount display (goggle type display), a car navigation system, a projector, a car stereo, a personal computer, a portable information terminal (mobile computer, portable telephone, electronic book or the like) and the like are given as examples of such electronic devices. FIGS. 8A to 8E and 9A to 9C show the examples.

Figure 8A:
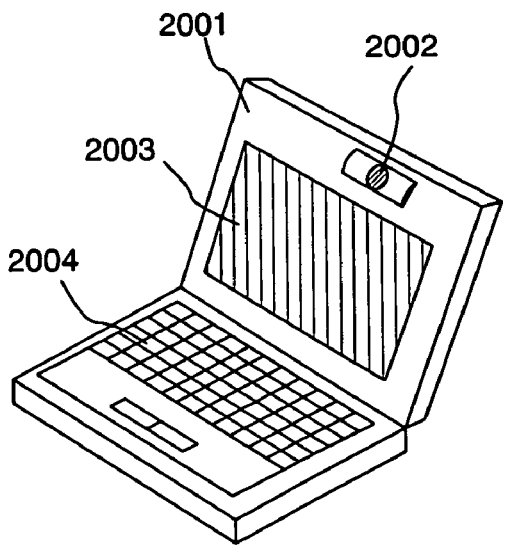
FIGS. 8A to 8E show examples of electronic equipments (Embodiment 3)

FIG. 8A is a personal computer which includes a main body 2001, an image input portion 2002, a display portion 2003, a keyboard 2004 and the like.

Figure 8B:
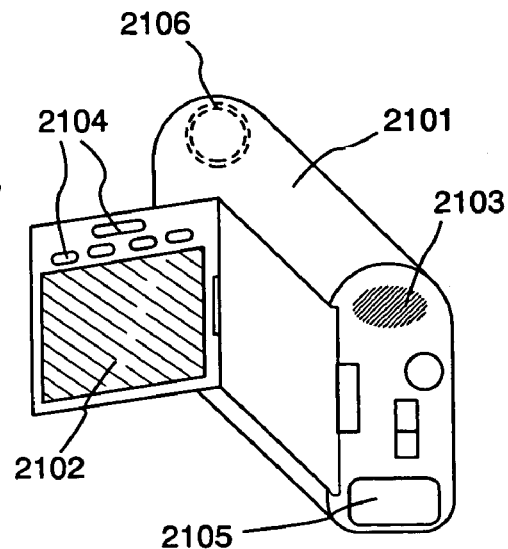

FIG. 8B is a video camera which includes a main body 2101, a display portion 2102, a voice input portion 2103, an operation switch 2104, a battery 2105, an image receiving portion 2106, and the like.

Figure 8C:
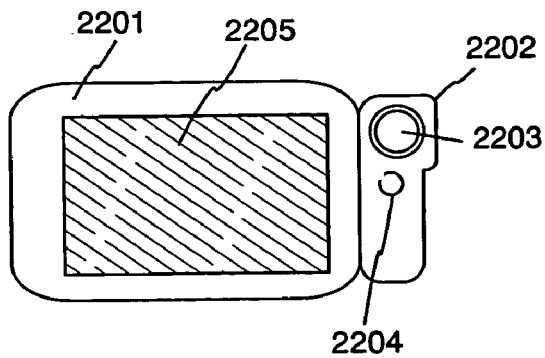

FIG. 8C is a mobile computer which includes a main body 2201, a camera portion 2202, an image receiving portion 2203, an operation switch 2204, a display portion 2205, and the like.

Figure 8D:
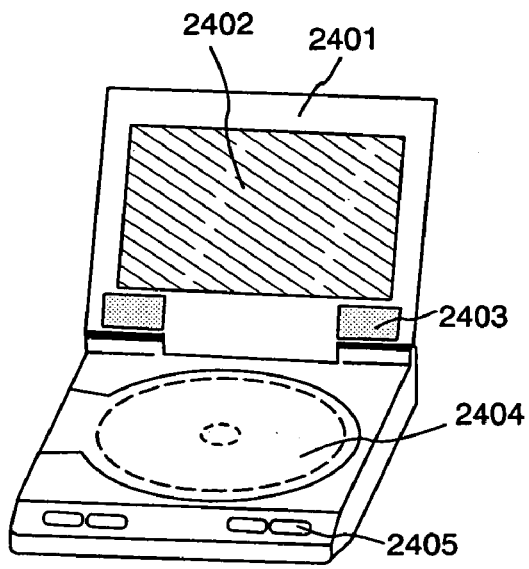

FIG. 8D is a goggle type display which includes a main body 2301, a display portion 2302, an arm portion 2303, and the like.

Figure 8E:
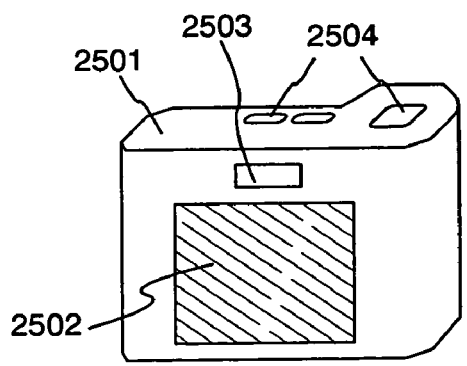

FIG. 8E is a player using a record medium recorded with programs (hereinafter, referred to as record medium) which includes a main body 2401, a display portion 2402, a speaker portion 2403, a record medium 2404, an operation switch 2405, and the like. Further, DVD (Digital Versatile Disc) or CD is used as a record medium, thereby enjoying music, movie, the game or Internet.

FIG. 8F is a digital camera which includes a main body 2501, a display portion 2502, an eye-piece portion 2503, an operation switch 2504, an image receiving portion (not illustrated), and the like.

Figure 9A:
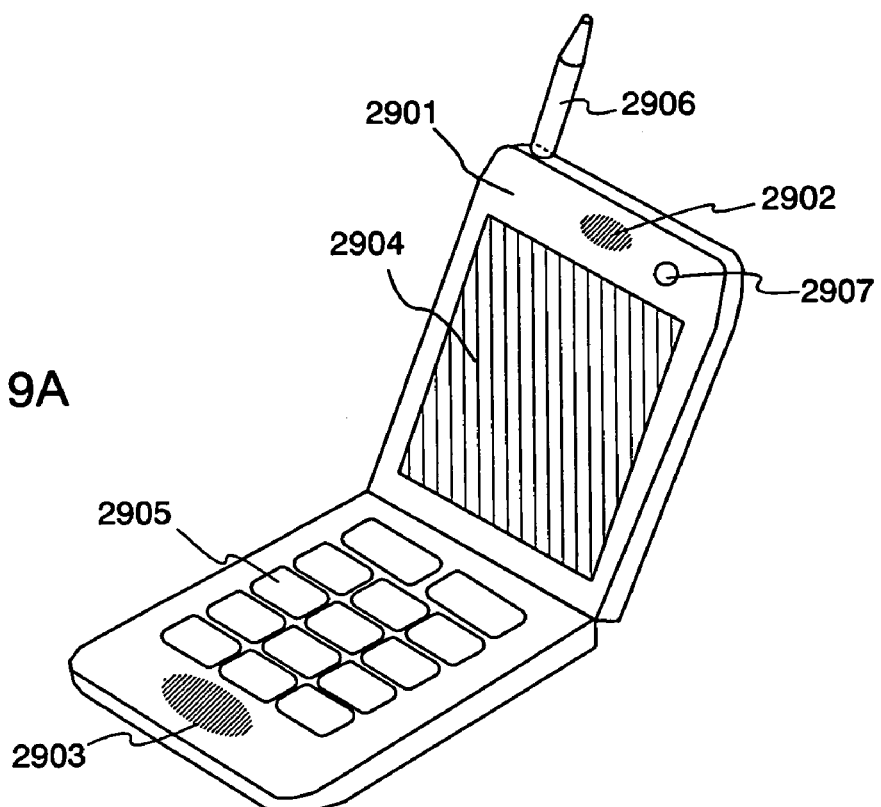
FIGS. 9A to 9C show examples of electronic equipments (Embodiment 3).

FIG. 9A is a portable telephone which includes a main body 2901, a voice output portion 2902, a voice input portion 2903, a display portion 2904, an operation switch 2905, an antenna 2906, an image input portion (such as CCD or image sensor) 2907 and the like.

Figure 9B:
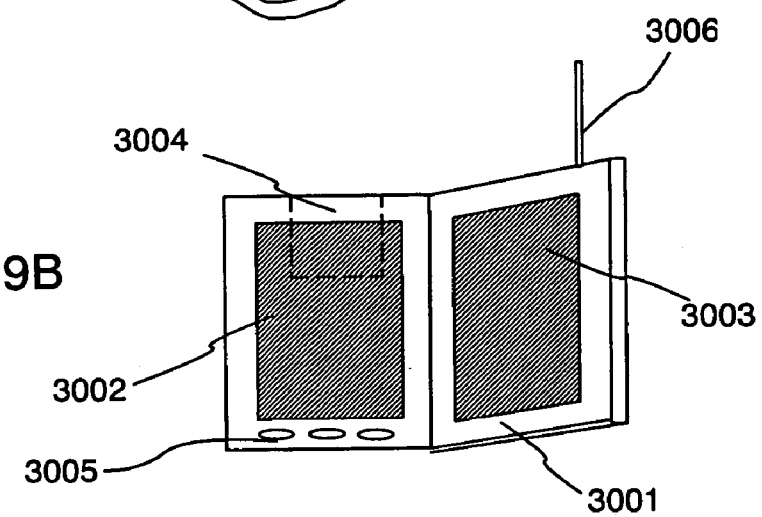

FIG. 9B is a portable book (electronic book) which includes a main body 3001, display portions 3002 and 3003, a record medium 3004, an operation switch 3005, an antenna 3006, and the like.

Figure 9C:
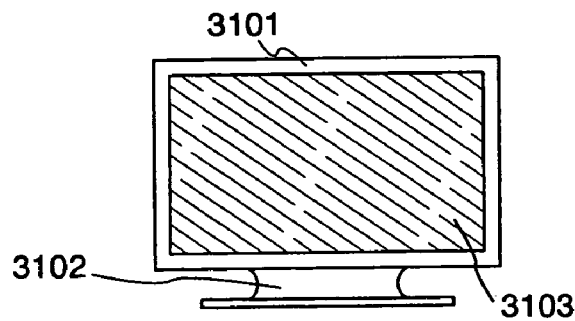

FIG. 9C is a display which includes a main body 3101, a support base 3102, a display portion 3103, and the like.

Incidentally, the size of the display shown in FIGS. 9C is middle, small or large, for example, the screen size is 5 to 20 inches. Further, in order to form the display portion of this size, it is preferable to carry out mass production using a substrate 1 m square by taking multiple patterns.

As described above, the range in which the present invention is applied extremely wide and the present invention can be applicable to a method for manufacturing electronic apparatus in all the fields. Further, the electronic apparatus in this embodiment can be realized by a structure comprising any combination of Embodiment Modes 1 to 3 and Embodiments 1 and 2.

According to the present invention, a transparent sealing material can fill a space, without containing air bubbles over the pixel portion and being exposed to heat or UV light, when a pair of substrates are bonded. A light-emitting device having high reliability can therefore be obtained.

What is claimed is:

1. A method for manufacturing a light emitting device comprising a pixel portion having a plurality of light emitting elements between a pair of substrates, the light emitting element comprising a first electrode, a layer containing a compound formed over the first electrode, a second electrode formed over the layer containing the compound, the method comprising a step of bonding the pair of substrates with each other, wherein a first sealing material is applied to one of the pair of substrates, and a catalyst for curing the first sealing material is formed over the other one of the pair of substrates, and wherein the pixel portion is covered with the first sealing material.

2. A method for manufacturing a light emitting device according to claim 1, wherein the catalyst is formed by a vapor deposition.

3. A method for manufacturing a light emitting device according to claim 1, wherein the catalyst is formed by a spin coating.

4. A method for manufacturing a light emitting device according to claim 1, further comprising a second sealing material formed so as to surround the pixel portion, and the second sealing material has opening portions in at least four corners.

5. A method for manufacturing a light emitting device according to claim 4, wherein the second sealing material has a higher viscosity than that of the first sealing material.

6. A method for manufacturing a light emitting device according to claim 1, further comprising a protective layer between the second electrode and the first sealing material, and the protective layer comprises one selected from the group consisting of $CaF_2$, $MgF_2$, and $BaF_2$.

7. A method for manufacturing a light emitting device according to claim 1, wherein the first sealing material comprises one selected from the group consisting of an alicyclic epoxy resin, an aromatic epoxy resin, and an aliphatic epoxy resin.

8. A method for manufacturing a light emitting device according to claim 1, wherein the catalyst comprises one selected from the group consisting of aluminum chloride (III), iron chloride(III), antimony pentachloride, aluminum bromide, titanium tetrachloride, tin tetrachloride, zinc chloride, and copper chloride.

9. A method for manufacturing a light emitting device comprising:

forming an electroluminescence layer over a first electrode formed over a first substrate;

forming a second electrode over the electroluminescence layer;

forming a catalyst layer for curing a first sealing material over the second electrode;

applying the first sealing material over a second substrate; and bonding the first substrate and the second substrate with each other.

10. A method for manufacturing a light emitting device according to claim 9, wherein the catalyst is formed so as to cover at least the pixel portion.

11. A method for manufacturing a light emitting device according to claim 9, wherein the catalyst is formed by a vapor deposition.

12. A method for manufacturing a light emitting device according to claim 9, wherein the catalyst is formed by a spin coating.

13. A method for manufacturing a light emitting device according to claim 10, wherein the first sealing material is formed so as to spread more widely than a region in which the catalyst is formed after bonding the first substrate and the second substrate.

14. A method for manufacturing a light emitting device according to claim 9, further comprising a second sealing material formed so as to surround the pixel portion, and the second sealing material has opening portions in at least four corners.

15. A method for manufacturing a light emitting device according to claim 14, wherein the second sealing material has a higher viscosity than that of the first sealing material.

16. A method for manufacturing a light emitting device according to claim 9, further comprising a protective layer between the second electrode and the first sealing material, and the protective layer comprises one selected from the group consisting of $CaF_2$, $MgF_2$, and $BaF_2$.

17. A method for manufacturing a light emitting device according to claim 9, wherein the first sealing material comprises one selected from the group consisting of an alicyclic epoxy resin, an aromatic epoxy resin, and an aliphatic epoxy resin.

18. A method for manufacturing a light emitting device according to claim 9, wherein the catalyst comprises one selected from the group consisting of aluminum chloride (III), iron chloride(III), antimony pentachloride, aluminum bromide, titanium tetrachloride, tin tetrachloride, zinc chloride, and copper chloride.

19. A method for manufacturing a light emitting device comprising:
    forming an electroluminescence layer over a first electrode formed over a first substrate;
    forming a second electrode over the electroluminescence layer;
    applying a first sealing material over the first substrate;
    forming a catalyst layer for curing the first sealing material over a second substrate; and
    bonding the first substrate and the second substrate with each other.

20. A method for manufacturing a light emitting device according to claim 19, wherein the catalyst is formed in such a shape that at least a whole surface of the pixel portion is covered by the catalyst.

21. A method for manufacturing a light emitting device according to claim 19, wherein the catalyst is formed by a vapor deposition.

22. A method for manufacturing a light emitting device according to claim 19, wherein the catalyst is formed by a spin coating.

23. A method for manufacturing a light emitting device according to claim 20, wherein the first sealing material is formed so as to spread more widely than a region in which the catalyst is formed after bonding the first substrate and the second substrate.

24. A method for manufacturing a light emitting device according to claim 19, further comprising a second sealing material formed so as to surround the pixel portion, and the second sealing material has opening portions in at least four corners.

25. A method for manufacturing a light emitting device according to claim 24, wherein the second sealing material has a higher viscosity than that of the first sealing material.

26. A method for manufacturing a light emitting device according to claim 19, further comprising a protective layer between the second electrode and the first sealing material, and the protective layer comprises one selected from the group consisting of $CaF_2$, $MgF_2$, and $BaF_2$.

27. A method for manufacturing a light emitting device according to claim 19, wherein the first sealing material comprises one selected from the group consisting of an alicyclic epoxy resin, an aromatic epoxy resin, and an aliphatic epoxy resin.

28. A method for manufacturing a light emitting device according to claim 19, wherein the catalyst comprises one selected from the group consisting of aluminum chloride (III), iron chloride(III), antimony pentachloride, aluminum bromide, titanium tetrachloride, tin tetrachloride, zinc chloride, and copper chloride.

29. A method for manufacturing a light emitting device according to claim 1, wherein the light emitting device is incorporated into at least one selected from the group consisting of a video camera, a digital camera, a head mount display, a navigation system, a projector, a personal computer, a mobile computer, a portable telephone, and an electronic book.

30. A method for manufacturing a light emitting device according to claim 9, wherein the light emitting device is incorporated into at least one selected from the group consisting of a video camera, a digital camera, a head mount display, a navigation system, a projector, a personal computer, a mobile computer, a portable telephone, and an electronic book.

31. A method for manufacturing a light emitting device according to claim 19, wherein the light emitting device is incorporated into at least one selected from the group consisting of a video camera, a digital camera, a head mount display, a navigation system, a projector, a personal computer, a mobile computer, a portable telephone, and an electronic book.

32. A method for manufacturing a light emitting device comprising:
    forming an electroluminescence layer over a first electrode formed over a first substrate;
    forming a second electrode over the electroluminescence layer;
    forming a catalyst layer for curing a first sealing material over the second electrode;
    applying the first sealing material over a second substrate;
    bonding the first substrate and the second substrate with each other; and
    dividing the first substrate and the second substrate into a plurality of panels after the bonding step.

33. A method for manufacturing a light emitting device according to claim 32, wherein the catalyst is formed so as to cover at least the pixel portion.

34. A method for manufacturing a light emitting device according to claim 32, wherein the catalyst is formed by a vapor deposition.

35. A method for manufacturing a light emitting device according to claim 32, wherein the catalyst is formed by a spin coating.

36. A method for manufacturing a light emitting device according to claim 33, wherein the first sealing material is formed so as to spread more widely than a region in which the catalyst is formed after bonding the first substrate and the second substrate.

37. A method for manufacturing a light emitting device according to claim 32, further comprising a second sealing material formed so as to surround the pixel portion, and the second sealing material has opening portions in at least four corners.

38. A method for manufacturing a light emitting device according to claim 37, wherein the second sealing material has a higher viscosity than that of the first sealing material.

39. A method for manufacturing a light emitting device according to claim 32, further comprising a protective layer between the second electrode and the first sealing material, and the protective layer comprises one selected from the group consisting of $CaF_2$, $MgF_2$, and $BaF_2$.

40. A method for manufacturing a light emitting device according to claim 32, wherein the first sealing material comprises one selected from the group consisting of an alicyclic epoxy resin, an aromatic epoxy resin, and an aliphatic epoxy resin.

41. A method for manufacturing a light emitting device according to claim 32, wherein the catalyst comprises one selected from the group consisting of aluminum chloride (III), iron chloride(III), antimony pentachloride, aluminum bromide, titanium tetrachloride, tin tetrachloride, zinc chloride, and copper chloride.

42. A method for manufacturing a light emitting device according to claim 32, wherein the light emitting device is incorporated into at least one selected from the group consisting of a video camera, a digital camera, a head mount display, a navigation system, a projector, a personal computer, a mobile computer, a portable telephone, and an electronic book.

43. A method for manufacturing a light emitting device comprising:
    forming an electroluminescence layer over a first electrode formed over a first substrate;
    forming a second electrode over the electroluminescence layer;
    applying a first sealing material over the first substrate;
    forming a catalyst layer for curing the first sealing material over a second substrate;
    bonding the first substrate and the second substrate with each other; and
    dividing the first substrate and the second substrate into a plurality of panels after the bonding step.

44. A method for manufacturing a light emitting device according to claim 43, wherein the catalyst is formed in such a shape that at least a whole surface of the pixel portion is covered by the catalyst.

45. A method for manufacturing a light emitting device according to claim 43, wherein the catalyst is formed by a vapor deposition.

46. A method for manufacturing a light emitting device according to claim 43, wherein the catalyst is formed by a spin coating.

47. A method for manufacturing a light emitting device according to claim 44, wherein the first sealing material is formed so as to spread more widely than a region in which the catalyst is formed after bonding the first substrate and the second substrate.

48. A method for manufacturing a light emitting device according to claim 43, further comprising a second sealing material formed so as to surround the pixel portion, and the second sealing material has opening portions in at least four corners.

49. A method for manufacturing a light emitting device according to claim 48, wherein the second sealing material has a higher viscosity than that of the first sealing material.

50. A method for manufacturing a light emitting device according to claim 43, further comprising a protective layer between the second electrode and the first sealing material, and the protective layer comprises one selected from the group consisting of $CaF_2$, $MgF_2$, and $BaF_2$.

51. A method for manufacturing a light emitting device according to claim 43, wherein the first sealing material comprises one selected from the group consisting of an alicyclic epoxy resin, an aromatic epoxy resin, and an aliphatic epoxy resin.

52. A method for manufacturing a light emitting device according to claim 43, wherein the catalyst comprises one selected from the group consisting of aluminum chloride (III), iron chloride(III), antimony pentachloride, aluminum bromide, titanium tetrachloride, tin tetrachloride, zinc chloride, and copper chloride.

53. A method for manufacturing a light emitting device according to claim 43, wherein the light emitting device is incorporated into at least one selected from the group consisting of a video camera, a digital camera, a head mount display, a navigation system, a projector, a personal computer, a mobile computer, a portable telephone, and an electronic book.

* * * * *